United States Patent
Hsieh

(10) Patent No.: US 8,327,313 B2
(45) Date of Patent: Dec. 4, 2012

(54) RE-ROUTING METHOD FOR CIRCUIT DIAGRAM

(75) Inventor: Hsiang-Yi Hsieh, Taipei (TW)

(73) Assignee: Inventec Corporation, Taipei (TW)

( * ) Notice: Subject to any disclaimer, the term of this patent is extended or adjusted under 35 U.S.C. 154(b) by 127 days.

(21) Appl. No.: 12/986,193

(22) Filed: Jan. 7, 2011

(65) Prior Publication Data
US 2012/0096422 A1    Apr. 19, 2012

(30) Foreign Application Priority Data
Oct. 19, 2010    (TW) .............................. 99135610 A

(51) Int. Cl.
*G06F 17/50*    (2006.01)
(52) U.S. Cl. ........ 716/137; 716/112; 716/129; 716/130; 716/131; 716/136
(58) Field of Classification Search ................. 716/137, 716/112, 129, 130, 131, 132, 136
See application file for complete search history.

(56) References Cited

U.S. PATENT DOCUMENTS

| | | | | |
|---|---|---|---|---|
| 5,074,037 A * | 12/1991 | Sutcliffe et al. | ................. | 29/847 |
| 5,187,671 A * | 2/1993 | Cobb | ............................ | 716/130 |
| 6,349,402 B1 * | 2/2002 | Lin | ................................ | 716/113 |
| 6,385,758 B1 * | 5/2002 | Kikuchi et al. | ................ | 716/122 |
| 6,847,853 B1 * | 1/2005 | Vinciarelli et al. | ............. | 700/97 |
| 6,915,249 B1 * | 7/2005 | Sato et al. | ........................ | 703/14 |
| 7,117,468 B1 * | 10/2006 | Teig et al. | ....................... | 716/129 |
| 7,914,304 B2 * | 3/2011 | Cartier et al. | ................... | 439/83 |
| 8,099,700 B1 * | 1/2012 | Waller et al. | ................... | 716/126 |
| 2006/0206844 A1 * | 9/2006 | Katou | ............................... | 716/5 |
| 2009/0050357 A1 * | 2/2009 | Suzuki | ........................... | 174/261 |
| 2009/0204934 A1 * | 8/2009 | Lin | ................................. | 716/14 |

FOREIGN PATENT DOCUMENTS

JP    11224973 A  *  8/1999
WO    WO 2005101937 A1  *  10/2005

* cited by examiner

*Primary Examiner* — Phallaka Kik
(74) *Attorney, Agent, or Firm* — CKC & Partners Co., Ltd.

(57) ABSTRACT

A re-routing method for a circuit diagram includes the following steps. At least one pair of the signal lines is obtained from a routed circuit diagram. The routed circuit diagram is adapted to be laid out on a substrate of a Printed Circuit Board (PCB). The substrate includes warp wires and weft wires. At least one pair of the signal lines includes two signal lines in parallel. The pair of signal lines includes several pairs of line segments. It is determined whether at least one pair of parallel line segments exists in the pairs of line segments parallel to the warp or weft wires. If at least one pair of parallel line segments exists, at least one pair of parallel line segments on the routed circuit diagram is replaced with several pairs of 10-degree lines. Respective angle between the 10-degree lines and the warp or weft wires are 10 degrees.

9 Claims, 5 Drawing Sheets

RE-ROUTING METHOD FOR CIRCUIT DIAGRAM

RELATED APPLICATIONS

This application claims priority to Taiwan Application Serial Number 099135610, filed Oct. 19, 2010, which is herein incorporated by reference.

BACKGROUND

1. Field of Invention

The present invention relates to a routing method, and more particularly, to a re-routing method for a circuit diagram.

2. Description of Related Art

In order to achieve the advantages of simplifying the fabrication of electronic devices, reducing the wirings between electronic components, and lowering the fabrication cost, people starts to research on a printing method to replace a wiring method, and thus develops a printed circuit board (PCB), which is also referred to as a printed wire board (PWB). The PCB is an important electronic component for providing wiring connection for electronic devices. A conventional circuit board adopts a process of printing etching resist to form the circuit wirings and diagram, and thus is referred to as the PCB or PWB. Due to continuous miniaturization and refinement of electronic products, most of the current circuit boards employ the method of attaching the etching resist (lamination or coating), and then use an etching process to form the circuit board after exposure and development.

Referring to FIG. 1, FIG. 1 is a schematic view of a conventional PCB 100. When a substrate 110 of the conventional PCB 100 is observed with a high magnification rate, the substrate 110 includes a plurality of warp wires 111 and a plurality of weft wires 112, which form an uneven surface like a fabric weave surface. Therefore, if a pair of the signal lines 120 and 130 is routed on the substrate 110 in a direction parallel to the weft wires 112 (as shown in FIG. 1), the pair of the signal lines 120 and 130 will be affected by the uneven surface when transmitting a pair of signals, and thus have different time delays. Besides, in other examples, when the pair of the signal lines 120 and 130 is routed on the substrate 110 in a direction parallel to the warp wires 111, the pair of the signal lines 120 and 130 also will have different time delays when transmitting a pair of signals. Under the circumstance of the increasing signal speed, different time delays of the pair of signals are susceptible to resulting in signal transmission errors.

SUMMARY

Therefore, an aspect of the present invention is to provide a re-routing method for a circuit diagram, so as to replace the pair of the signal line segments parallel to the warp wires or weft wires of the circuit board with several pairs of 10-degree lines. The re-routing method for the circuit diagram includes the following steps. At least one pair of the signal lines is obtained from a routed circuit diagram. The routed circuit diagram is adapted to be laid out on a substrate of a PCB, and the substrate includes a plurality of warp wires and a plurality of weft wires. The pair of the signal lines includes two signal lines arranged in parallel. The pair of the signal lines includes several pairs of line segments. It is determined whether at least one pair of parallel line segments exists in the pairs of the line segments parallel to the warp wires or the weft wires. When the at least one pair of parallel line segments exists, the at least one pair of parallel line segments on the routed circuit diagram is replaced with several pairs of 10-degree lines. An angle between the 10-degree lines and the warp wires or the weft wires is 10 degrees.

According to an embodiment of the present invention, the 10-degree lines include at least one pair of positive 10-degree lines and at least one pair of negative 10-degree lines. When at least one pair of parallel line segments is parallel to the warp wires, the angle of at least one pair of positive 10-degree lines relative to the warp wires is positive 10 degrees, and the angle of at least one pair of negative 10-degree lines relative to the warp wires is negative 10 degrees. When at least one pair of parallel line segments is parallel to the weft wires, the angle of at least one pair of positive 10-degree lines relative to the weft wires is positive 10 degrees, and the angle of at least one pair of negative 10-degree lines relative to the weft wires is negative 10 degrees. One end of at least one pair of positive 10-degree lines may be connected to one end of at least one pair of negative 10-degree lines.

Moreover, the step of replacing the at least one pair of parallel line segments on the routed circuit diagram with the 10-degree lines includes the following steps: A pair of connected line segments connected to the at least one pair of parallel line segments is obtained. A first angle included between the connected line segments and the positive 10-degree lines is calculated. A second angle included between the connected line segments and the negative 10-degree lines is calculated. When the first angle is greater than the second angle, one of the at least one pair of positive 10-degree lines is connected to the connected line segments. When the first angle is not greater than the second angle, one of the at least one pair of negative 10-degree lines is connected to the connected line segments.

According to another embodiment of the present invention, the re-routing method for the circuit diagram further includes the following steps. Before the step of replacing the at least one pair of parallel line segments on the routed circuit diagram with the 10-degree lines, it is determined whether a length of the at least one pair of parallel line segments is greater than a replacement length threshold. When the length of the at least one pair of parallel line segments is greater than the replacement length threshold, the at least one pair of parallel line segments on the routed circuit diagram is replaced with the 10-degree lines. When the length of the at least one pair of parallel line segments is not greater than the replacement length threshold, a pair of the connected line segments on the pair of signal lines connected to the at least one pair of parallel line segments is obtained, and the at least one pair of parallel line segments and the pair of connected line segments are modified to be smooth.

According to yet another embodiment of the present invention, each pair of 10-degree lines has the same length, and when there exist more than one pair of parallel line segments s, the re-routing method for the circuit diagram further includes the following step. The parallel line segments are replaced with the 10-degree lines by using the same warp wire or weft wire as a start point.

According to yet another embodiment of the present invention, the re-routing method for the circuit diagram further includes laying out the routed circuit diagram after replacement on the substrate.

It can be known from the above embodiments of the present invention that the application of the present invention has the following advantages. The parallel line segments on the PCB are replaced with the 10-degree lines, so as to avoid different transmission time required by the pair of signals on the pair of signal lines. Particularly, when the pair of signal lines transmits high-speed signals, the application of the present invention may further prevent the signal transmission errors caused by different transmission time required by the pair of signals. Moreover, when the lengths of the parallel line segments are short, the parallel line segments can be removed by performing smoothening treatments on the parallel line segments and the line segments connected to the parallel line segments. In addition, the plurality of pairs of parallel line segments which are also parallel to the texture of the warp or weft wires of the substrate can be replaced with the 10-degree lines at the same time, so as to prevent the 10-degree lines after replacement from intersecting each other and adversely affecting the signal transmission.

BRIEF DESCRIPTION OF THE DRAWINGS

In order to make the foregoing as well as other objectives, features, advantages, and embodiments of the present invention more clear and comprehensive, the accompanying drawings are described as follows.

DETAILED DESCRIPTION

Hereinafter, the spirit of the present invention is illustrated clearly with reference to the drawings and detailed description, and persons skilled in the art can make changes and modifications under the teaching of the present invention with reference to the embodiments without departing from the spirit and scope of the present invention.

Figure 1:
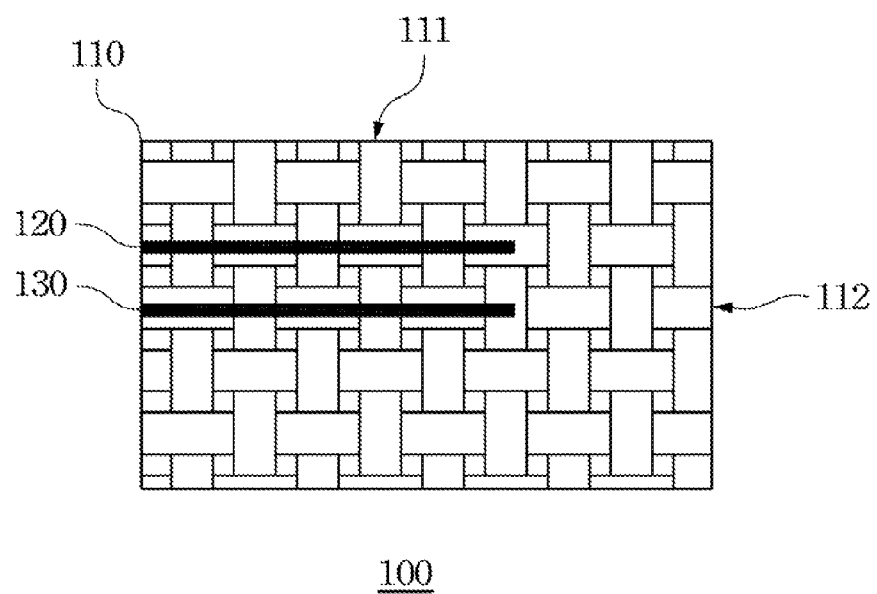
FIG. 1 is a schematic view of a conventional PCB 100.
Figure 2:
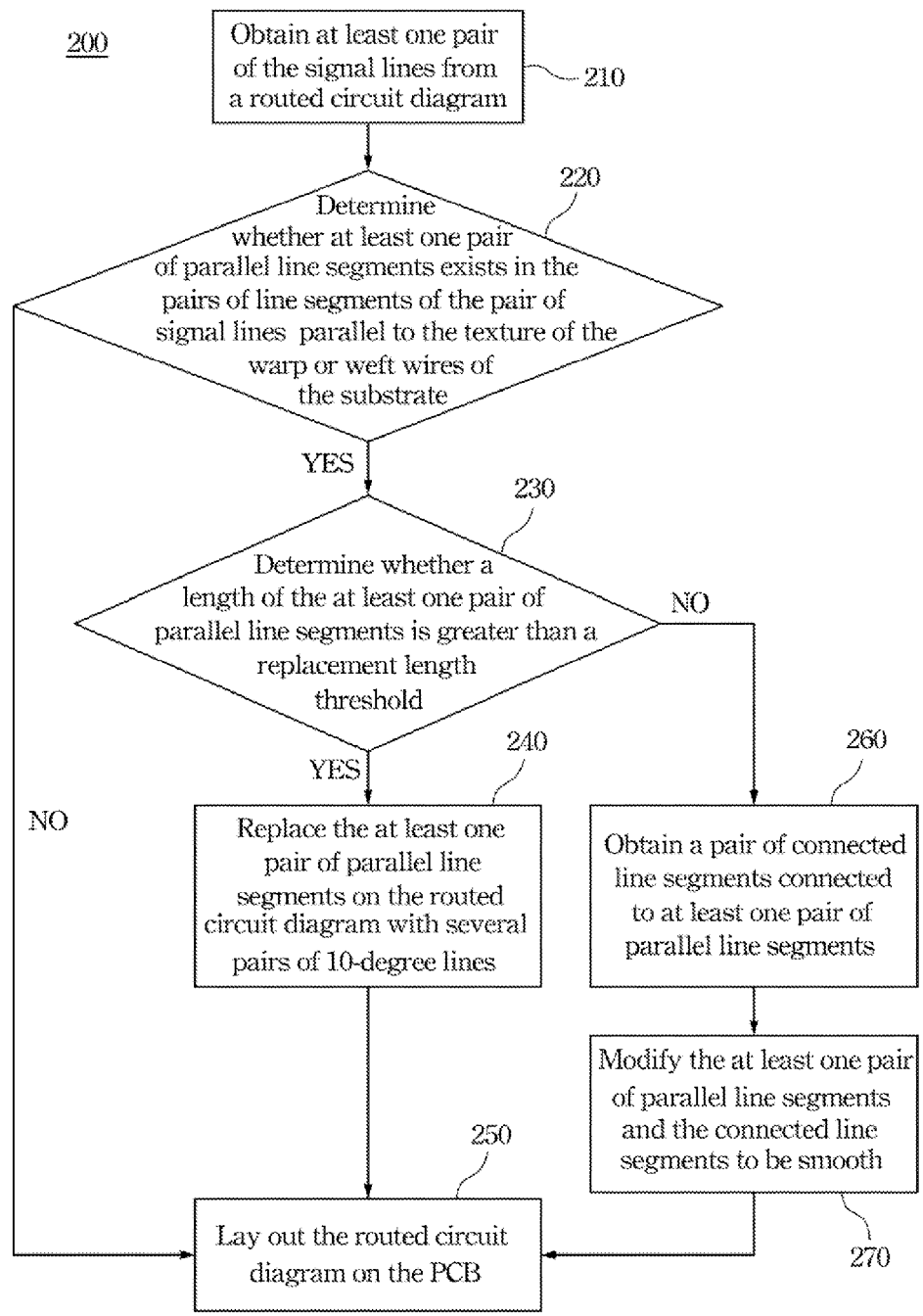
FIG. 2 is a flow chart showing a re-routing method for a circuit diagram according to an embodiment of the present invention.
Figure 3A:
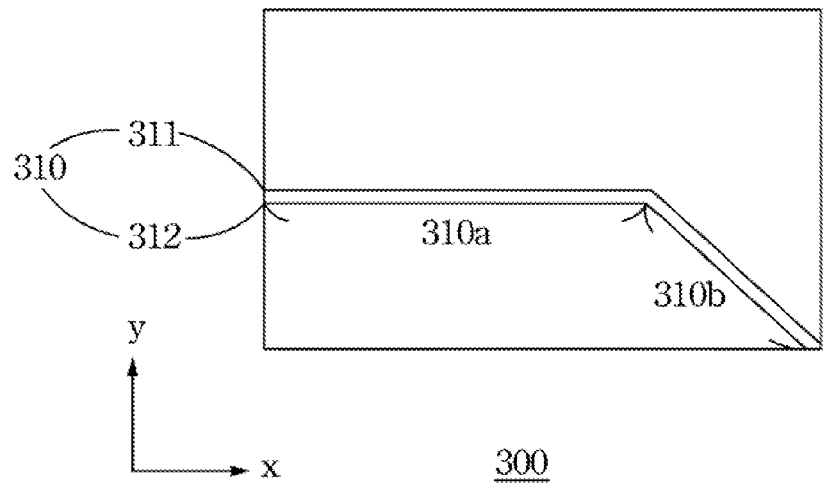
FIGS. 3A and 3B show a flow process of replacement with 10-degree lines performed on a routed circuit diagram.
Figure 3B:
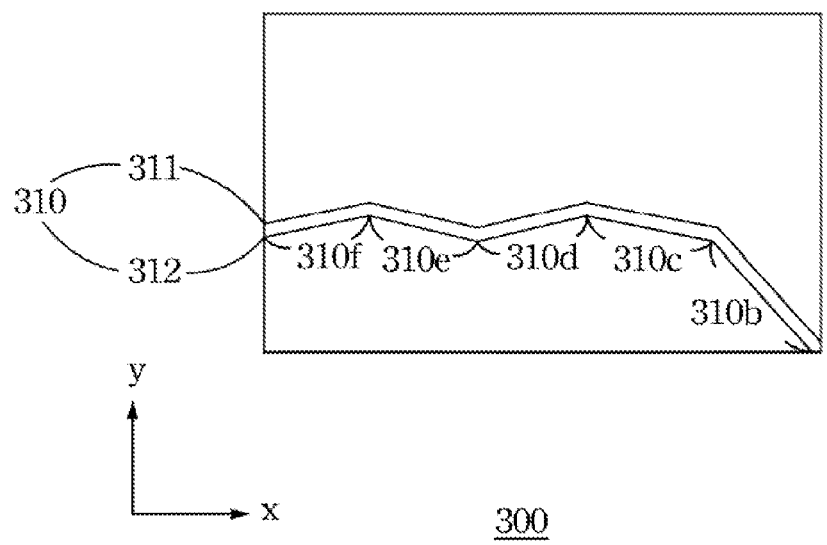
Figure 4:
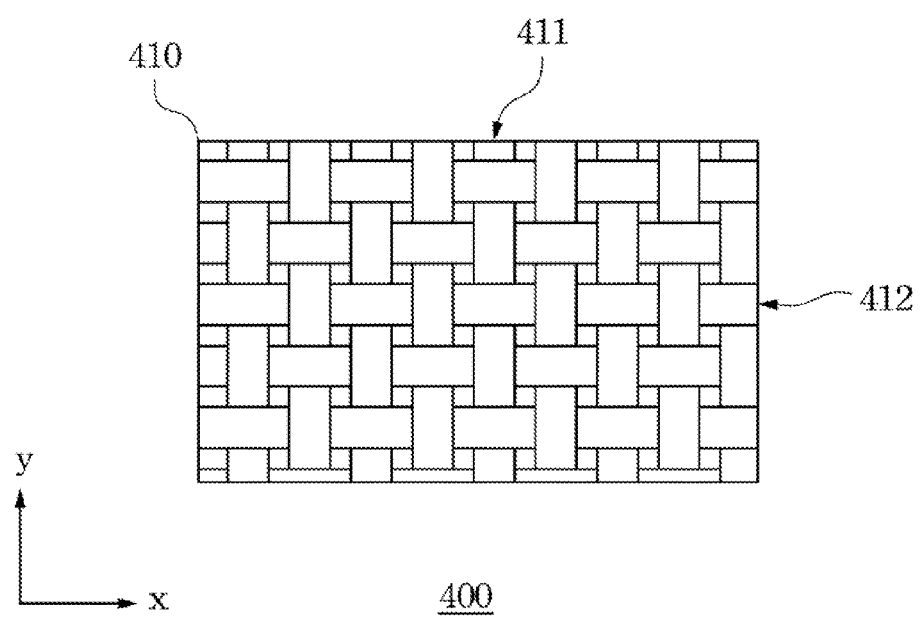
FIG. 4 shows a PCB according to an embodiment of the present invention.

FIG. 2 is a flow chart showing a re-routing method for a circuit diagram according to an embodiment of the present invention. FIGS. 3A and 3B show a flow process of replacement with 10-degree lines performed on a routed circuit diagram. FIG. 4 shows a PCB according to an embodiment of the present invention. The re-routing method for the circuit diagram is used for re-routing the routed circuit diagram to lay out the re-routed circuit diagram on a substrate of a PCB. Furthermore, the re-routing method for the circuit diagram replaces the pair of the signal line segments parallel to the warp wires or the weft wires of the substrate with several pairs of 10-degree lines. Therefore, referring to FIGS. 2, 3A, and 4, the re-routing method for the circuit diagram 200 includes the following steps.

In step 210, at least one pair of signal lines 310 is obtained from a routed circuit diagram 300. The routed circuit diagram 300 is adapted to be laid out on a substrate 410 of a PCB 400. The substrate 410 includes a texture of a plurality of warp wires 411 and a plurality of weft wires 412. The pair of signal lines 310 includes two signal lines 311 and 312 arranged in parallel. The pair of signal lines 310 includes a pair of line segments 310a and a pair of line segments 310b.

In step 220, it is determined whether at least one pair of parallel line segments exists in the pair of line segments 310a and the pair of line segments 310b of the pair of signal lines 310 parallel to the texture of the warp wires 411 or the weft wires 412 of the substrate 410. When no pair of parallel line segments exists in the pair of line segments 310a and the pair of 310b of the pair of the signal lines 310, the routed circuit diagram 300 can be laid out on the substrate 410 of the PCB 400 (step 250).

When at least one pair of parallel line segments exists in the pair of line segments 310a, 310b of the pair of signal lines 310, the at least one pair of parallel line segments on the routed circuit diagram 300 is replaced with several pairs of 10-degree lines (step 240), and the routed circuit diagram 300 after replacement is laid out on the PCB 400 (step 250). The angle included between each pair of 10-degree lines and the warp wires or weft wires parallel to at least one pair of parallel line segments is 10 degrees. The several pairs of 10-degree lines include at least one pair of positive 10-degree lines and at least one pair of negative 10-degree lines, and the numbers of the positive 10-degree lines and negative 10-degree lines are the same. When the at least one pair of parallel line segments is parallel to the warp wires 411, the angle of the positive 10-degree lines relative to the warp wires 411 is positive 10 degrees, and the angle of the negative 10-degree lines relative to the warp wires 411 is negative 10 degrees. When the at least one pair of parallel line segments is parallel to the weft wires 412, the angle of the positive 10-degree lines relative to the weft wires 412 is positive 10 degrees, and the angle of the negative 10-degree lines relative to the weft wires 412 is negative 10 degrees. Moreover, one end of the positive 10-degree lines is connected to one end of the negative 10-degree lines, and the positive 10-degree lines and the negative 10-degree lines are alternately used to replace the at least one pair of parallel line segments. In this manner, the parallel line segments on the PCB 400 are replaced with the 10-degree lines to avoid the signal transmission errors caused by different transmission time required by the pair of signals on the pair of signal lines 310.

For example, it is assumed that arrows x and y respectively indicate the texture directions of the weft wires 412 and warp wires 411 when the routed circuit diagram 300 is laid out on the substrate 410. Thus, in step 220, the pair of line segments 310a parallel to the arrow x is determined to be the parallel line segments parallel to the weft wires 412. Therefore, in step 240, if the parallel line segments 310a exist, the parallel line segments 310a on the routed circuit diagram 300 are replaced with several pairs of 10-degree lines 310c, 310d, 310e, 310f (as shown in FIG. 3B). The positive 10-degree lines 310c, 310e and the negative 10-degree lines 310d, 310f are alternately used to replace the parallel line segments 310a.

The grid point of the routed circuit diagram 300 is set to 100:20 to generate the 10-degree lines for replacement in step 240. Therefore, a length of the parallel line segments needs to be greater than a replacement length threshold for performing replacement with the 10-degree lines in step 240. Therefore, before step 240, it is determined whether the length of at least one pair of parallel line segments is greater than the replacement length threshold (step 230). Only when the length of the parallel line segments is greater than the replacement length threshold, the grid point setting of 100:20 is used to perform replacement with the 10-degree lines in step 240.

Moreover, if the length is not greater than the parallel line segments of the replacement length threshold, the parallel line segments and the connected line segments connected thereto are modified to be smooth. Therefore, when the length of the parallel line segments is not greater than the replacement length threshold, a pair of connected line segments connected to at least one pair of parallel line segments on the pair of signal lines is obtained. (step 260). Next, the at least one pair of parallel line segments and the connected line segments are modified to be smooth (step 270), and the routed circuit diagram 300 after smoothening treatments is laid out on the PCB 400 (step 250). In this manner, the short parallel line segments may be removed through the smoothening treatments.

In addition, in other embodiments, if there exist a plurality of pairs of parallel line segments which are likewise parallel to the warp wires 411 or the weft wires 412, the pairs of parallel line segments are replaced with the 10-degree lines in step 240 by using the same warp wire 411 or weft wire 412 as the starting points; and similarly by using the positive 10-degree lines or the negative 10-degree lines having the same length as the initial line segments. When the plurality of pairs of parallel line segments are all parallel to the warp wires 411, the pairs of parallel line segments are replaced with the 10-degree lines in step 240 by using the same weft wire 412 as the start points; and similarly by using the positive 10-degree lines or the negative 10-degree lines having the same length as the initial line segments. When the plurality of pairs of parallel line segments are all parallel to the weft wires 412, the pairs of the parallel line segments are replaced with the 10-degree lines in step 240 by using the same warp wire 411 as the start points; and similarly by using the positive 10-degree lines or the negative 10-degree lines having the same length as the initial line segments. In this manner, the plurality of pairs of parallel line segments are replaced with the 10-degree lines at the same time, thereby avoiding the intersection of the replaced 10-degree lines for adversely affecting the signal transmission.

Figure 5:
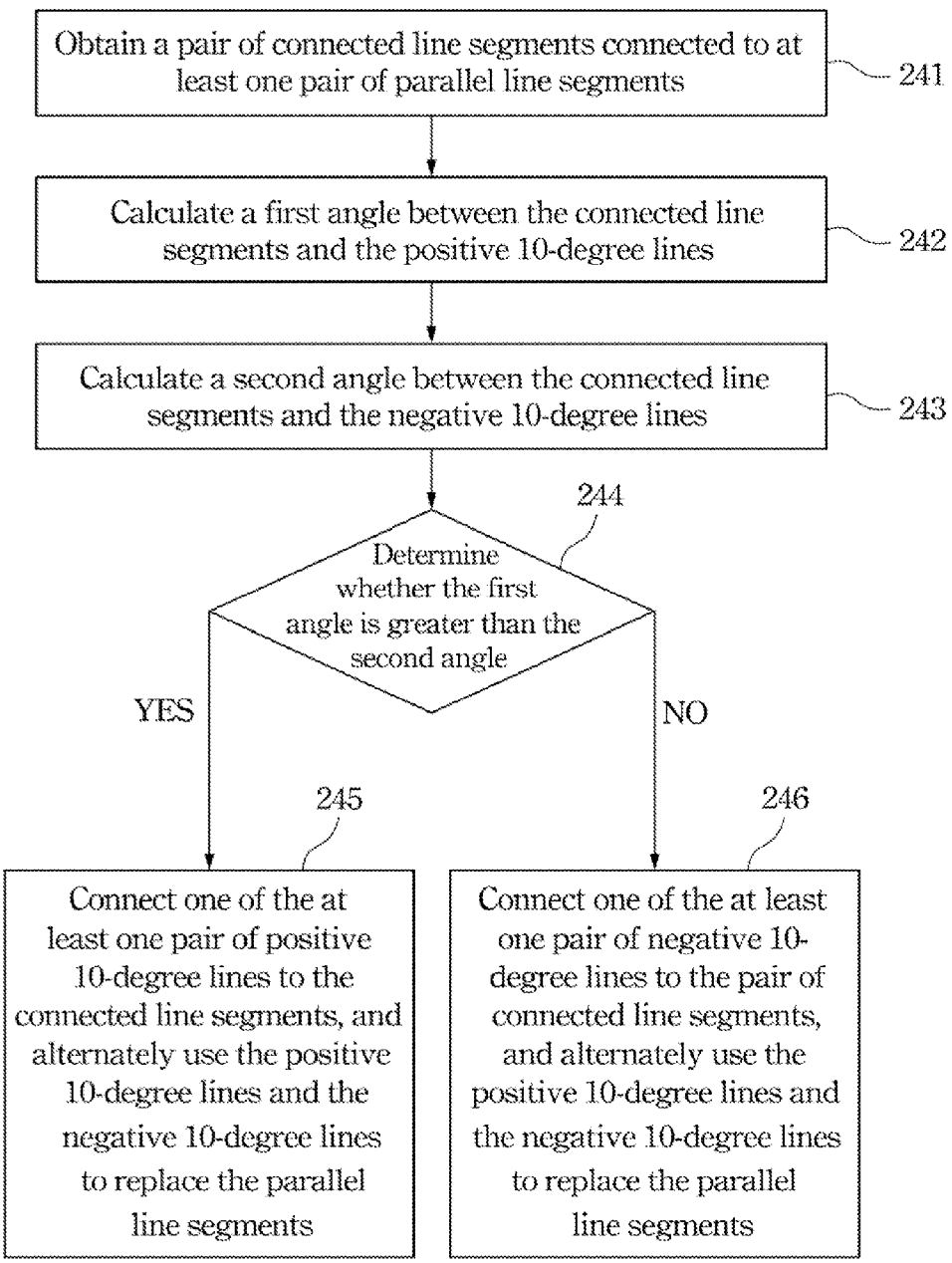
FIG. 5 shows an embodiment of replacing at least one pair of parallel line segments on a routed circuit diagram 300 with several pairs of 10-degree lines (step 240).

Moreover, when the replacement in step 240 is performed, for preventing the angle between the 10-degree lines and the connected line segments previously connected to the parallel line segments from being too small for affecting the signal transmission quality, the 10-degree line with a larger angle relative to the connected line segments is selected for connection. Referring to FIG. 5, FIG. 5 shows an embodiment of replacing the at least one pair of parallel line segments on the routed circuit diagram 300 with several pairs of 10-degree lines (step 240). The step of replacing the at least one pair of parallel line segments on the routed circuit diagram 300 with several pairs of 10-degree lines (step 240) includes the following steps.

In step 241, a pair of connected line segments on the pair of signal lines 310 connected to at least one pair of parallel line segments is obtained.

In step 242, a first angle included between the connected line segments and the positive 10-degree lines is calculated.

In step 243, a second angle included between the connected line segments and the negative 10-degree lines is calculated.

In step 244, it is determined whether the first angle is greater than the second angle.

In step 245, if the first angle is greater than the second angle, one of the at least one pair of positive 10-degree lines is connected to the connected line segments, and the positive 10-degree lines and the negative 10-degree lines are alternately used to replace the parallel line segments.

In step 246, if the first angle is not greater than the second angle, one of the at least one pair of negative 10-degree lines is connected to the pair of connected line segments, and the positive 10-degree lines and the negative 10-degree lines are alternately used to replace the parallel line segments.

Therefore, by using steps 241 to 246, the angle included between the 10-degree lines after replacement and the connected line segments previously connected to the parallel line segments is prevented from being too small, thereby improving the signal transmission quality.

From the above embodiments of the present invention, it can be known that the application of the present invention has the following advantages. The parallel line segments on the PCB are replaced with the 10-degree lines to avoid different transmission time required by the pair of signals on the pair of the signal lines. Particularly, when the pair of signal lines transmits high-speed signals, the application of the present invention can further prevent the signal transmission errors caused by different transmission time required by the pair of signals. Moreover, when the lengths of the parallel line segments are short, the parallel line segments can be removed through smoothening treatments of the parallel line segments and the line segments connected to the parallel line segments. In addition, the plurality of pairs of parallel line segments which are also parallel to the texture of the warp wires or weft wires of the substrate can be replaced with the 10-degree lines at the same time, so as to prevent the 10-degree lines after replacement from intersecting each other and adversely affecting the signal transmission.

It will be apparent to persons skilled in the art that various variations and modifications can be made to the present invention without departing from the scope and spirit of the invention. In view of the foregoing, it is intended that the present invention cover variations and modifications of the present invention provided they fall within the scope of the present invention as defined by the claims.

What is claimed is:

1. A re-routing method for a circuit diagram, the re-routing method comprising:
   obtaining at least one pair of signal lines from a routed circuit diagram, wherein the routed circuit diagram is adapted to be laid out on a substrate of a printed circuit board (PCB), the substrate comprising a plurality of warp wires and a plurality of weft wires, the at least one pair of signal lines comprising two parallel signal lines, the pair of the signal lines comprising a plurality of pairs of line segments;
   determining whether at least one pair of parallel line segments exists in the pairs of line segments parallel to the warp wires or the weft wires;
   replacing the at least one pair of parallel line segments on the routed circuit diagram with a plurality of pairs of 10-degree lines using a computer when there exists at least one pair of parallel line segments, wherein respective angles included between the pairs of 10-degree lines and the warp wires or the weft wires are 10 degrees; and
   laying out the routed circuit diagram after replacement on the substrate of the PCB.

2. The re-routing method of claim 1, wherein the pairs of 10-degree lines comprise at east one pair of positive 10-degree lines and at least one pair of negative 10-degree lines.

3. The re-routing method of claim 2, wherein the step of replacing the at least one pair of parallel line segments on the routed circuit diagram with the pairs of 10-degree lines comprises:
   obtaining from the at least one pair of the signal lines a pair of connected line segments connected to the at least one pair of parallel line segments;
   calculating a first angle included between the pair of connected line segments and the pair of positive 10-degree lines;
   calculating a second angle included between the pair of connected line segments and the pair of negative 10-degree lines;
   connecting one of the at least one pair of positive 10-degree lines to the pair of connected line segments when the first angle is greater than the second angle; and connecting one of the at least one pair of negative 10-degree lines to the pair of connected line segments when the first angle is not greater than the second angle.

4. The re-routing method of claim , wherein when the at least one pair of parallel line segments is parallel to the warp wires, an angle of the at least one pair of positive 10-degree lines relative to the warp wires is positive 10 degrees, and an angle of the at least one pair of negative 10-degree lines relative to the warp wires is negative 10 degrees.

5. The re-routing method of claim 2, wherein when the at least one pair of parallel line segments is parallel to the weft wires, an angle of the at least one pair of positive 10-degree lines relative to the weft wires is positive 10 degrees, and an angle of the at least one pair of negative 10-degree lines relative to the weft wires is negative 10 degrees.

6. The re-routing method of claim 2, wherein one end of the at least one pair of positive 10-degree lines is connected to one end of the at least one pair of negative 10-degree lines.

7. The re-routing method of claim 1, further comprising:
before the step of replacing the at least one pair of parallel line segments on the routed circuit diagram with the pairs of 10-degree lines, determining whether a length of the at least one pair of parallel line segments is greater than a replacement length threshold; and
when a length of the at least one pair of parallel line segments is greater than the replacement length threshold, replacing the at least one pair of parallel line segments on the routed circuit diagram with the pairs of 10-degree lines.

8. The re-routing method of claim 7, further comprising:
when a length of the at least one pair of parallel line segments is not greater than the replacement length threshold, obtaining from the at least one pair of the signal lines a pair of connected line segments connected to the at least one pair of parallel line segments, and modifying the at least one pair of parallel line segments and the pair of connected line segments to be smooth.

9. The re-routing method of claim 1, wherein the lengths of the pairs of 10-degree lines are same, and when there exist more than one pair of parallel line segments, the method further comprises:
replacing the pairs of the parallel line segments with the pairs of 10-degree lines by using the same warp wire or weft wire as starting points.

* * * * *